(12) United States Patent
Kuhara et al.

(10) Patent No.: US 6,218,684 B1
(45) Date of Patent: Apr. 17, 2001

(54) PHOTODIODE WITH BUFFER LAYER

(75) Inventors: Yoshiki Kuhara; Yasuhiro Iguchi; Tadashi Saito; Hitoshi Terauchi, all of Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/206,156

(22) Filed: Dec. 7, 1998

(30) Foreign Application Priority Data

Dec. 9, 1997 (JP) .................................................. 9-361744

(51) Int. Cl.$^7$ .................... H01L 31/072; H01L 31/109; H01L 31/0328; H01L 31/0336
(52) U.S. Cl. ................... 257/184; 257/185; 257/190; 257/461; 438/93; 438/94
(58) Field of Search .................... 257/184, 183, 257/185, 190, 191, 465, 461; 438/94, 93

(56) References Cited

U.S. PATENT DOCUMENTS

| 5,010,381 | * | 4/1991 | Shiba | 357/30 |
| 5,811,842 | * | 9/1998 | Funaba | 257/186 |
| 6,002,142 | * | 12/1999 | Paoli | 257/21 |

FOREIGN PATENT DOCUMENTS

| 363001029 | * | 1/1988 | (JP) . |
| 363038269 | * | 2/1988 | (JP) . |
| 401196182 | * | 8/1989 | (JP) . |
| 402220480 | * | 9/1990 | (JP) . |
| 404093088 | * | 3/1992 | (JP) . |

* cited by examiner

Primary Examiner—William Mintel
(74) Attorney, Agent, or Firm—Smith, Gambrell & Russell, LLP

(57) ABSTRACT

A half-transmittance photodiode usable as a photodetector in receivers for "ping-pong transmission" is improved in temperature characteristic, so that a half-transmittance photodiode usable at low temperatures is available. A p-n junction is formed in a buffer layer, not in an absorption layer.

15 Claims, 12 Drawing Sheets

Diagram for optical bi-directional communications

Conventional complete-absorption photodiode

Previously fabricated half-transmittance photodiode

P-dopant density profile of the photodiode of the present invention

Fabricating process for a half-transmittance photodiode wafer

Plan view of a photodiode

Responsivity-temperature characteristic of the photodiode of the present invention Relation between Fermi level Ef and acceptor density Na Fig. 14  Conventional standard photodiode
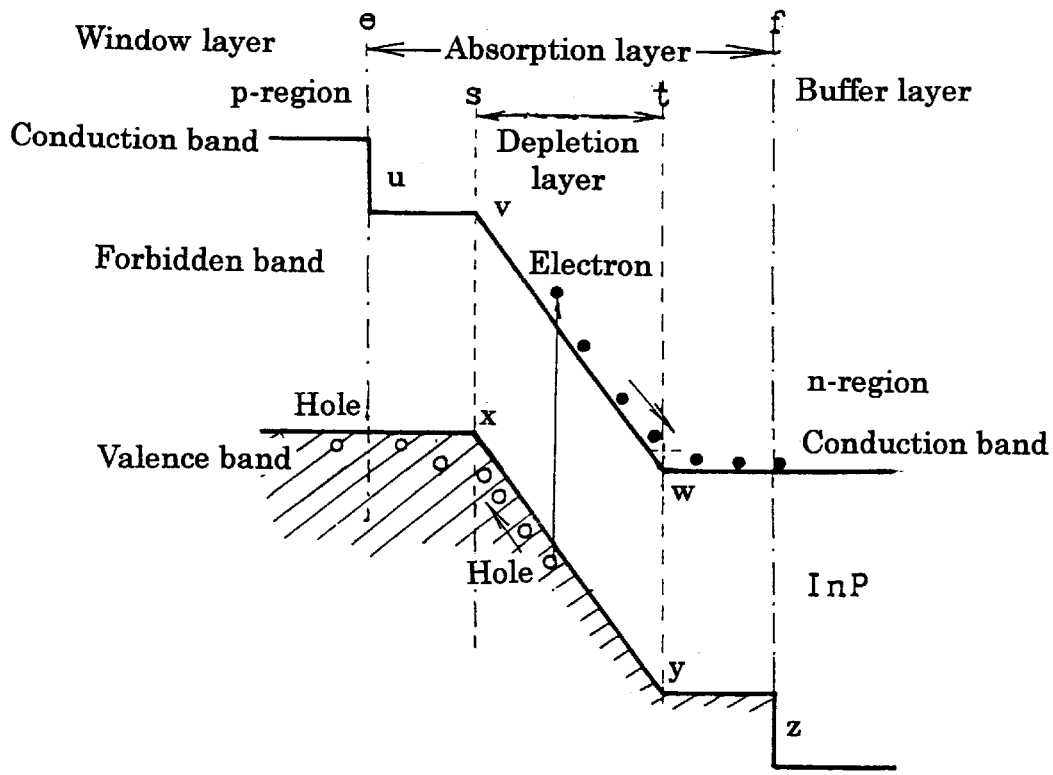
Fig. 15  Previously fabricated half-transmittance photodiode
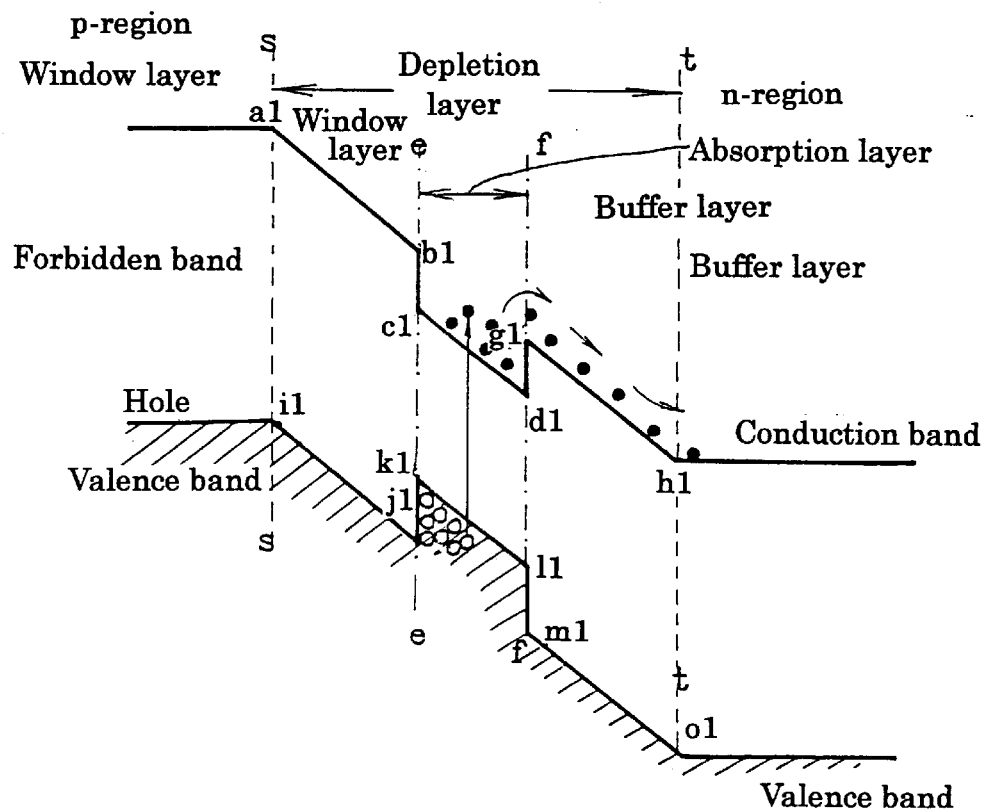

Half-transmittance photodiode of the present invention

PHOTODIODE WITH BUFFER LAYER

BACKGROUND OF THE INVENTION

1. Field of the Invention

The present invention relates to a photodiode (PD) used in a system where light with a single wavelength is transmitted over a single optical fiber for bi-directional communications. More specifically, the invention relates to a photodiode used suitably for time-compression-multiplexing (TCM) transmission, or so-called "ping-pong transmission", based on time division using 1.3-$\mu$m-region light for transmission and reception.

2. Description of the Background Art

FIG. 1 is a diagram showing a simplified constitution of bi-directional communications. A laser diode LD1 at a central office sends an optical signal. An optical coupler 2 introduces the signal into a fiber 3, and an optical coupler 4 guides it to a photodiode PD2 at a subscriber, such as a house. This is downstream traffic. A signal from the subscriber is sent out by an LD2. The signal travels through the optical coupler 4, the fiber 3, and the optical coupler 2 and reaches a PD1 at the office. This is upstream traffic.

There are two systems in bi-directional communications; one is simultaneous transmission and reception, and the other is alternate transmission and reception with time division. Some types use light having two or more wavelengths, and others use light having one wavelength. When light having two or more wavelengths are used, a wavelength-division-multiplexing coupler must be provided additionally. The present invention relates to the improvement of a photodiode used in a simple bi-directional communications system that transmits and receives signals having one wavelength on a time-division basis.

Since transmission and reception are conducted alternately, this system is called "ping-pong transmission." It is the simplest bi-directional communications since only one kind of light is used. Still it needs optical couplers in order to transmit the upstream and the downstream light over the same optical fiber. When two optical fibers are used, optical couplers are not necessary, but the cost for installing the fibers will increase. Therefore, transmission and reception over a single fiber is desirable. Optical couplers seem essential parts when coming and going signals travel over the same single fiber, because two kinds of light must be selected so that one kind is sent to the photodiode, and the other to the fiber after receiving it from the laser diode. However, optical couplers are expensive and increase the installation cost at subscribers. Therefore, optical communication without optical couplers is desirable.

A previous invention by the present inventors enabled the realization of this seemingly unattainable object. According to the invention, a photodiode is devised to absorb a half of light having a particular wavelength, and the photodiode and a laser diode are connected in tandem so that transmitted or received light propagates linearly. The laser diode is placed behind the photodiode so that the transmitted light from the laser diode passes through the photodiode and enters an optical fiber linearly. The photodiode absorbs half the transmitted light from the laser diode, allowing the other half to pass through. Similarly, the photodiode absorbs and detects half the received light from the fiber, allowing the other half to pass through and reach the laser diode, which is inactive then because of "ping-pong transmission" and causes no bad-effects. The condition of transmitted light and received light being halved is allowed when a sufficient amount of light is transmitted. This system does not require separation of optical path and eliminates an expensive optical coupler. In the system shown in FIG. 1 also, both the transmitted and received light are reduced to half by the optical couplers.

The previous invention described above was offered in Japanese patent application Tokuganhei 9-256107 filed on Sep. 3, 1997. This idea revolutionized the conventionally accepted knowledge that a photodiode is to absorb incident light 100 percent. Such a photodiode that absorbs a half of incident light is called a half-transmittance photodiode or simply transmittance photodiode.

FIG. 2 is a constitution diagram of a light transmission and reception module that has a combination of the above-mentioned transmittance photodiode and a laser. A fiber 62, a lens 126, a transmittance photodiode 64, and a laser 70 are aligned. No optical coupler is present. The light transmission and reception module may be produced at an impressively low cost. The ping-pong transmission with time division made this possible.

A half-transmittance photodiode has a thin absorption layer. A sufficiently thick (about 4 $\mu$m) absorption layer of conventional photodiodes absorbs all the incident light. The half-transmittance photodiode is materialized by making its thickness "d" equal to $(\ln 2)/\alpha$, where $\alpha$ means an absorption coefficient, and $\ln 2$ is the natural logarithm of 2. Depending on a wavelength, the thickness is very thin, 0.7 or 1.0 $\mu$m when InGaAs or InGaAsP are used for the absorption layer, for example.

The extremely thin absorption layer of a half-transmittance photodiode posed a new challenge. The present invention is directed toward further improvement of the half-transmittance photodiode. As applications of light communications spread, the use in a wider temperature range or with a lower source voltage is strongly demanded. Conventional indoor use allowed the device to operate within a range of 0 to 40° C. The demand for outdoor use is widening the temperature range to −40 to +85° C. It was difficult for the above-mentioned half-transmittance photodiode to operate stably in such a wide range of temperature. In addition, a source voltage of 5 V is being replaced by 3.3 V to preserve energy. With such a low voltage, p-n junctions sometimes do not receive sufficient voltage to operate normally.

Whereas a conventional photodiode having a thick absorption layer has a satisfactory temperature characteristic, the half-transmittance photodiode having a thin absorption layer developed by the present inventors showed a decrease in responsivity at low temperatures, a peculiar phenomenon not seen in conventional photodiodes.

FIG. 5 is a graph showing temperature characteristics of the above-mentioned half-transmittance photodiode with a parameter of source voltage. The axis of abscissa represents temperature (° C.), and the axis of ordinate responsivity (A/W). The source voltages are 4 to 10 V, 3 V, 2 V, 1 V, and 0 V. When the source voltage is 4 to 10 V, the responsivity does not decrease, remaining about 0.47 A/W. However, when the source voltage is 3 V, the responsivity reduces by half at −40° C. or below. When the voltage is 2 V, the responsivity begins to decrease at a higher temperature, 20° C., and shows about 0.16 A/W at −20° C. Such a remarkable decrease in responsivity at a temperature close to normal temperature is not seen in an ordinary photodiode, hence no such a decrease is reported.

This poor temperature characteristic deprives the invented half-transmittance photodiode of chances to be used outdoors or in cold climate. Because the photodiode is used in combination with an amplifier in an actual application, a source voltage of 3.3 V will drop to about 2 V across the photodiode. With such a low voltage, the temperature characteristic is too poor for the photodiode to be used below 25° C.

A light transmission and reception module with a half-transmittance photodiode and without an optical coupler will lose the usefulness thereof significantly if the module must be replaced by a combination of a conventional, complete-absorption-type photodiode and an optical coupler for outdoor or cold climate use.

The principal object of the present invention is to offer a half-transmittance photodiode that does not become inferior in characteristics at low temperatures. Another object of the invention is to offer a half-transmittance photodiode that operates at low source voltages.

The principle of the photodiode of the invention is hard to understand because causes it is contrary to the common accepted knowledge for photodiodes. The invention is for fundamental improvement. This requires basic studies of the principle of photodiodes. An explanation of the internal structures of a conventional photodiode and the half-transmittance photodiode are given below, followed by a fundamental description of the meaning of "a p-n junction" and a"reverse bias".

A. Structure of a Conventional 100-percent Absorption-type Photodiode

A conventional InP-based photodiode has a stratified structure and impurity-density profile as shown in FIG. 3. In order to increase responsivity, incident light should be completely absorbed by a thick absorption layer (about 4 $\mu$m). All the light having a shorter wavelength than a certain wavelength is absorbed by the absorption layer. A semiconductor and an insulation cannot absorb the light having lower energy (hv) than the band-gap energy (Eg) (Eg>hv), because the light has insufficient energy (hv) (hv<Eg) to excite electrons from the valence band to the conduction band. On the contrary, the light having higher energy (hv) than the band-gap energy (Eg) (hv>Eg) is absorbed, because electrons are excited to the conduction band, generating free electron-hole pairs.

An absorption layer ($Eg_2$) has a narrower band gap than that ($Eg_1$) of the other layers, i.e., a substrate, buffer layer, and window layer ($Eg_2<Eg_1$). The light having energy higher than the band-gap energy of the absorption layer ($Eg_2$) and lower than that of the other layers ($Eg_2<hv<Eg_1$) will transmit through the other layers freely, but will be absorbed by the absorption layer.

Hence, a photodiode for detecting 1.3 $\mu$m or 1.55 $\mu$m light has an InP substrate, InP buffer layer, InP window layer, and InGaAs absorption layer. The InP having a wide band gap will transmit all the light having a wavelength of 1.3 $\mu$m or 1.55 $\mu$m. The InGaAs having a narrow band gap will absorb and detect the light of 1.3 $\mu$m or 1.55 $\mu$m. As an absorption layer, quaternary InGaAs having a wider band gap is sometimes used. This material has a higher energy gap than the energy of 1.55 $\mu$m light, so that it detects only 1.3 $\mu$m light without reacting to 1.55 $\mu$m light.

As mentioned above, the absorption layer having a narrow band gap converts light to free electron-hole pairs. The layer is also called an active layer because it can perform such energy conversion. When the layer is sufficiently thick, all the light having a shorter wavelength than that which corresponds to the band-gap energy of the layer may be absorbed with high responsivity. In order to increase the responsivity, it is necessary to thicken the layer as shown in FIG. 3, where the thickness of the InGaAs layer is 4 $\mu$m.

Another essential element besides the absorption layer is a p-n junction. Without a p-n junction, a photodiode cannot be a photodiode. Traditionally, the p-n junction is provided in the absorption layer to separate the free electron-hole pairs by a reverse-bias voltage.

With an n-type semiconductor, a p-n junction may be produced by doping p-type impurities into n-type semiconductor layers (the window and absorption layers). Zinc, cadmium, or magnesium may be used as the p-type impurity, and it is common to produce a p region by diffusing zinc thermally. A plane where the donor density of an n-type semiconductor balances with the acceptor density of a p-type semiconductor is a p-n junction.

FIG. 3 shows the stratified structure and the diffused density of zinc for a standard (typically conventional) InP-based photodiode. The axis of abscissa represents the structure of the layers in the order of a window layer, absorption layer, buffer layer, and substrate. The axis of ordinate represents the diffused zinc density with a logarithmic scale. The n-type InP window layer has an impurity density of $n=2 \times 10^{15}$ $cm^{-3}$, for instance. The n-type InGaAs absorption layer has an impurity density of $n=1 \times 10^{15}$ $cm^{-3}$, for instance. Zinc diffuses thermally from the n-type InP window layer (from a to b) to the n-type InGaAs absorption layer (from b to c). Since the diffusion is conducted from the window layer, the zinc density decreases with increasing the distance from the window layer.

The region where p-type impurity density exceeds innate n-type impurity density becomes a p-region. Since the window layer has an n-type impurity density of $n=2\times 10^{15}$ $cm^{-3}$, zinc density must be higher than that. Actually, a much higher density ($p>1 \times 10^{18}$ $cm^{-3}$) is given to get lower resistance. This is a high-density $p^+$-region (A region). The boundary zone between the window and absorption layers is also a high-density p-type region.

The n-type InGaAs absorption layer is intrinsically low in impurity density as $n=1 \times 10^{15}$ $cm^{-3}$ or so. Zinc density higher than that can change the layer into p-region (B-region: b to c). The zinc density decreases abruptly inside the absorption layer.

The density of the diffused zinc reaches the value $p=1 \times 10^{15}$ $cm^{-3}$ at the point c, where the number of n-type impurities equals that of p-type impurities (n=p). This is a p-n junction, which is developed inside the absorption layer.

A region under the p-n junction is still n-type (n>p). Zinc scarcely diffuses to the buffer layer and substrate. Since the absorption layer is low-density n-type, the region close to the p-n junction is low in p-type impurity density. In order to reduce the resistance by increasing electrical conductivity, a thick substrate has high-carrier density.

A conventional photodiode has an absorption layer as thick as 4 $\mu$m. A p-n junction lies in the absorption layer. A depletion layer is in the absorption layer. A strong electric field exists only in the depletion layer.

When light with a long wavelength (hv) enters a window layer (band gap is $Eg_1$), if $hv<Eg_1$, the light transmits through the window layer and reaches an absorption layer. If the energy of the incident light (hv) is higher than the band-gap energy of the absorption layer ($Eg_2$) ($Eg_1>hv>Eg_2$), the light generates free electron-hole pairs there. Newly generated free electrons are attracted toward the n-side by a strong electric field, and holes toward the p-side, so that they are separated and cannot recombine. Respective flows of electrons toward the n-side region and holes toward the p-side region generate an electric current between the electrodes. This current is known as a photocurrent. This phenomenon makes it possible to convert light into an electric current to be detected.

A source voltage generates an electric field in the depletion layers produced on both sides of the p-n junction. The reason why the p-n junction lies in the absorption layer is that a strong electric field must be produced in the absorption layer so that the generated free electrons and holes are separated. Therefore, it is a prerequisite for the p-n junction to lie in the absorption layer.

B. Structure of the Half-transmittance Photodiode Previously Offered by the Present Inventors FIG. 4 is an example of the diffused-zinc density in the half-transmittance photodiode the present inventors offered before. An absorption layer is of In—GaAs having a narrow band gap. When thickness d of InGaAs is made equal to $(\ln 2)/\alpha$, where ln is the natural logarithm, and $\alpha$ is the absorption coefficient of InGaAs, a half of incident light is absorbed and the other half transmits. Because $\alpha=0.99\,\mu m^{-1}$ for 1.3 $\mu$m in wavelength, the photodiode has a thickness of d=0.7 $\mu$m, as thin as about ⅙ that of conventional photodiodes.

In order to form a low-resistance p-type layer in an n-type InP window layer, the density of the diffused zinc should be considerably high (p>1×10$^{18}$ cm$^{-3}$). Since the InGaAs absorption layer is thin (0.7 $\mu$m), very shallow diffusion is required to provide a p-n junction (n=p) in the layer. However, diffusion cannot provide a sharp edge of distribution thereof. If the p-n junction is planned to lie at the innermost part (j) of the absorption layer, the hetero-interface (i) between the window and absorption layers may have a zinc density of less than 1×10$^{18}$ cm$^{-3}$ as shown in FIG. 4. Because the p-region at the hetero-interface is a weak p-region, a potential barrier in the valence band tends to appear at the hole side.

A half-transmittance photodiode thus fabricated has a poor temperature characteristic as shown in FIG. 5. A responsivity drop at low temperatures is notable. A low source voltage particularly exacerbates this tendency. This phenomenon does not appear in conventional photodiodes. In order to study the reason why, the responsivity is plotted as a function of the reciprocal of temperature as shown in FIG. 6. The axis of abscissa is 1000/T (K$^{-1}$); the axis of ordinate is responsivity with a logarithmic scale. The source voltage is 0, 1, 2, 3, 4, and 5 V. The same data used in FIG. 5 is used again with the axis of abscissa converted from temperature in Celsius to the reciprocal of absolute temperature. When a source voltage is 0, 1, 2, or 3 V, a liner line is produced. The gradient of these lines gives activation energy $\Delta E_a$ of 0.29 eV. When the temperature dependency of the intensity of a phenomenon may be written as exp(-$\Delta E_a$/kT), where k signifies the Boltsman's constant and T an absolute temperature, the value over kT is called activation energy. When the temperature dependency of the probability of the occurrence of a reaction that requires to surmount a potential barrier of $\Delta$ may be expressed in this form, Arrhenius originally called the energy activation energy.

In other words, FIG. 6 means that the phenomenon occurring in the photodiode having a thin absorption layer is performed by surmounting the potential barrier of 0.29 eV.

Why such a potential barrier is produced and where a potential discontinuity appears is explained below.

The reason why the half-transmittance photodiode has the conspicuous temperature dependency was thoroughly examined from various standpoints by the present inventors. The temperature dependency reveals that the phenomenon accompanies the activation energy of 0.29 eV. In searching for an explanation of this, it was noticed that 0.29 eV is close to half the difference between the band gap of InP (1.35 eV) and that of InGaAs (0.75 eV). It was inferred that the foregoing energy difference actually appears at the hetero-interface between InP and InGaAs. In the fabrication of the aforementioned half-transmittance photodiode, emphasis was placed on making the absorption layer thin and forming a p-n junction in the InGaAs absorption layer. The p-n junction is a plane that links the points where n-type impurity density is equal to p-type impurity density (p=n), and the InGaAs absorption layer is intrinsically low in impurity density.

Accordingly, the p-type impurity density must be reduced in the thin absorption layer (about 0.7 $\mu$m). Because zinc diffuses thermally, the density gradient cannot be sharp depthwise. This means that the zinc density cannot be increased at the interface between the InP window layer and the InGaAs absorption layer (hetero-interface); i.e., the zinc density at the hetero-interface is low. It is considered that since the zinc density is low, charge carriers might be trapped at a potential barrier produced at the hetero-interface between the window and absorption layers. The height of the barrier is conjectured as (1.35–0.75)/2=0.3 eV or so. The necessary energy for the carrier to surmount the potential barrier at the hetero-interface is about 0.3 eV. The above-mentioned activation energy (0.29 eV) derived from the responsivity-temperature characteristic is almost equal to the energy needed for surmounting the barrier at the interface between the window and absorption layers. At low temperatures, as the disturbance by thermal motion decreases, the probability of surmounting the potential barrier decreases. This is considered to be the reason why the responsivity decreases at low source voltages and low temperatures.

A zinc-density profile was examined in an actual wafer sample depthwise by the secondary ion microspectroscopy (SIMS). The result for a conventional photodiode having a thick absorption layer is shown in FIG. 3. The results of the half-transmittance photodiode having a thin absorption layer previously offered by the present inventors are shown in FIG. 4. The conventional diode has a zinc density of more than 1×10$^{18}$ cm$^{-3}$ at the hetero-interface between the window layer (n=1×10$^{18}$ cm$^{-3}$) and the absorption layer (n=1×10$^{15}$ cm$^{-3}$) as shown in FIG. 3. On the other hand, the half-transmittance diode has a considerably lower zinc density than 1×10$^{18}$ cm$^{-3}$ at the hetero-interface; that is, a highly dense p$^+$-region does not exist at the hetero-interface between the window and absorption layers.

More specifically, zinc diffusion does not produce such a uniform high-density p$^+$-region as often explained in text books. As shown in FIG. 3, behind a high-density A region, there exists a B region where the density steeply declines. Further behind that, there is a C region where the density moderately lessens. A p-n junction (n=p) is developed in the low-density C region. On the other hand, the heterojunction produces a band gap difference, which confronts carriers as a barrier. If the carrier density is low or the temperature is low, the carrier cannot surmount the barrier. In conclusion, it is necessary to skillfully arrange the A, B, and C regions along with the position of the hetero-interface in order to operate the photodiode properly. If a p-n junction is developed in the thin absorption layer, the energy barrier at the hetero-interface interferes without exception.

SUMMARY OF THE INVENTION

The photodiode of the present invention comprises a semiconductor substrate, buffer layer, absorption layer, and window layer that are formed successively in this order, wherein a p-n junction is provided at the buffer layer not at the absorption layer. When an epitaxial wafer having an n-type buffer layer, n-type absorption layer, and n-type window layer on an n-type substrate is doped with p-type impurities for producing a p-region, the p-region ranging over the window, absorption, and buffer layers is produced. The n-type substrate should have high density in n-type impurities to heighten the electrical conductivity thereof, hence $n=1\times10^{18}$ to $1\times10^{19}$ cm$^{-3}$, for example. The buffer layer should have low impurity density to draw in the p-n junction, hence $n=(0.5$ to $3)\times10^{15}$ cm$^{-3}$ or so. The InGaAs or InGaAsP absorption layer has n-type impurity density of $(0.5$ to $3)\times10^{15}$ cm$^{-3}$ or so. The window layer should also have low impurity density of $(1$ to $4)\times10^{15}$ cm$^{-3}$ or so. So long as the window layer is low in resistance when it turns into p-type, the n-type impurity density thereof has nothing to do with electrical conduction. The hetero-interface between the window and absorption layers has p-type impurity density of $p=(1$ to $5)\times10^{18}$ cm$^{-3}$, for example. The hetero-interface between the absorption and buffer layers has p-type impurity density of $3\times10^{15}$ cm$^{-3}$ or more. The place where p-type impurity density equals n-type impurity density (p=n) in the buffer layer is where the p-n junction resides. Since this place lies in the buffer layer, it is self-evident that the p-type impurity density at the interface between the absorption and buffer layers ($3\times10^{15}$ cm$^{-3}$ or more) is greater than the n-type impurity density in the buffer layer ($n=(0.5$ to $3)\times10^{15}$ cm$^{-3}$).

It is designed so that the depletion layer generated on both sides of the p-n junction in the buffer layer does not intrude into the absorption layer. The buffer layer should have sufficient thickness to meet this requirement. Because the depletion layer has a thickness of 1 to 3 $\mu$m, depending on the impurity density and source voltage, it is desirable that the buffer layer have a thickness of 3 $\mu$m or more, about 4 $\mu$m, for example.

When fabricated with a thickness of 0.7 $\mu$m, the InGaAs absorption layer transmits a half of long-wavelength light (1.3 and 1.5 $\mu$m regions). Because the transmittance may be roughly half, the thickness is designed to be 0.5 to 0.9 $\mu$m.

When fabricated with a thickness of 1 $\mu$m, the InGaAsP absorption layer transmits a half of long-wavelength light (1.3 $\mu$m region). Because the transmittance may be roughly half, the thickness is designed to be 0.8 to 1.2 $\mu$m.

In the above, simple expressions such as InGaAs and InGaAsP are used. Actually, though, they are matched with the lattice of an InP layer. With the ternary InGaAs, only one composition can exist, which consequently determines only one band gap strictly. However, with the quaternary InGaAsP, the lattice matching cannot determine the composition exclusively. The composition may be determined arbitrarily. A fundamental absorption-edge wavelength may be selected as 1.40 to 1.44 $\mu$m, for example. If so selected, only a wavelength of 1.3 $\mu$m may be detected.

The point of the present invention is to provide a p-n junction in a buffer layer, without relying on the conduction type of a substrate or buffer layer. The invention is also applicable to a diode with a p-type substrate.

When an epitaxial wafer having a p-type buffer layer, p-type absorption layer, and p-type window layer that are grown in succession in this order on a p-type substrate is doped with n-type impurities, an n-type region ranging over the window, absorption, and buffer layers is produced. In other words, the impurities are doped further inside. The doping may be carried out by thermal diffusion or ion injection. The point is to form a p-n junction in the buffer layer, not in the absorption layer, by diffusing impurities deep inside.

A photodiode having a p-n junction formed in a buffer layer is unparalleled without question. The p-n junction has been believed to be formed in an absorption layer, also known as an active layer. A depletion layer on both sides of the p-n junction is subjected to almost the entire reverse-bias voltage and a strong electric field is produced there. The absorption layer absorbs light and generates free electron-hole pairs, which are then separated by the electric field, causing a photocurrent to flow.

According to the present invention, while an electric field is produced in a buffer layer, carrier pairs are generated in an absorption layer. The place where a reverse-bias voltage exists (the buffer layer) differs from the place where carrier pairs are generated (the absorption layer). The absorption layer, however, has a gradient of impurity density, which produces a built-in electric field. The field separates the generated carrier pairs, causing a photocurrent to flow. The newly invented photodiode functions with an entirely different principle than that which conventional photodiodes operate by separating carrier pairs with the reverse-bias voltage.

BRIEF DESCRIPTION OF THE DRAWING

In the drawing:

FIG. 14 is a band diagram of a conventional standard photodiode having a thick absorption layer that includes a depletion layer formed on both sides of a p-n junction.

FIG. 15 is a band diagram of a half-transmittance photodiode having a thin absorption layer that includes a p-n junction, with the absorption layer surrounded by a depletion layer.

DETAILED DESCRIPTION OF THE INVENTION

A conventional photodiode inevitably has a p-n junction in an absorption layer. In a half-transmittance photodiode having a thin absorption layer, a p-n junction in the absorption layer reduces responsivity at low temperatures. To solve the problem, the conception was converted. Conventional photodiodes have without exception a p-n junction inside an absorption layer. The reason why the p-n junction is provided in the absorption layer in the conventional photodiodes was studied.

Conventional photodiodes have a p-n junction inside an absorption layer for the following purposes to achieve high-speed operation (several Mbps to Gbps):
(a) To concentrate an electric field in the absorption layer to accelerate carriers at high speed.
(b) To reduce the electrostatic capacity of a depletion layer on both sides of the p-n junction by increasing the thickness of the depletion layer.

As for (a) above, incident light is absorbed only at the InGaAs absorption layer having a narrow band gap, and carriers are generated there. Without a strong electric field, generated carriers will recombine. The depletion layer on both sides of the p-n junction is subjected to almost the entire source voltage and thus has a strong electric field. As for (b) above, the greater the thickness d of the depletion layer, the smaller the capacity thereof. A higher source voltage produces a greater d, causing the capacity to decrease. The above explains why the p-n junction is provided in the absorption layer.

However, as for (b), provided that the capacity is reduced by increasing the thickness d, the depletion layer may exist anywhere. Source-voltage increase causes increased thickness of the depletion layer and a decreased capacity thereof. This is applicable regardless of the location of the depletion layer.

Figure 1:
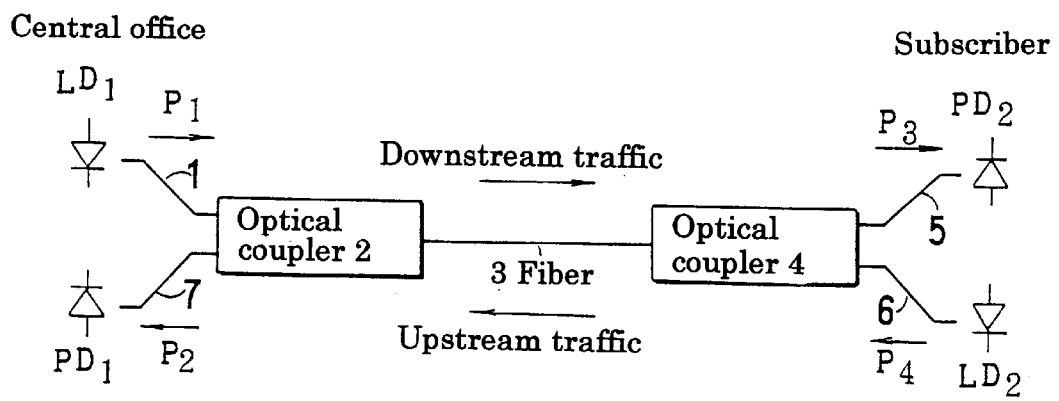
FIG. 1 is a schematic diagram for time-division bi-directional optical communications.
Figure 2:
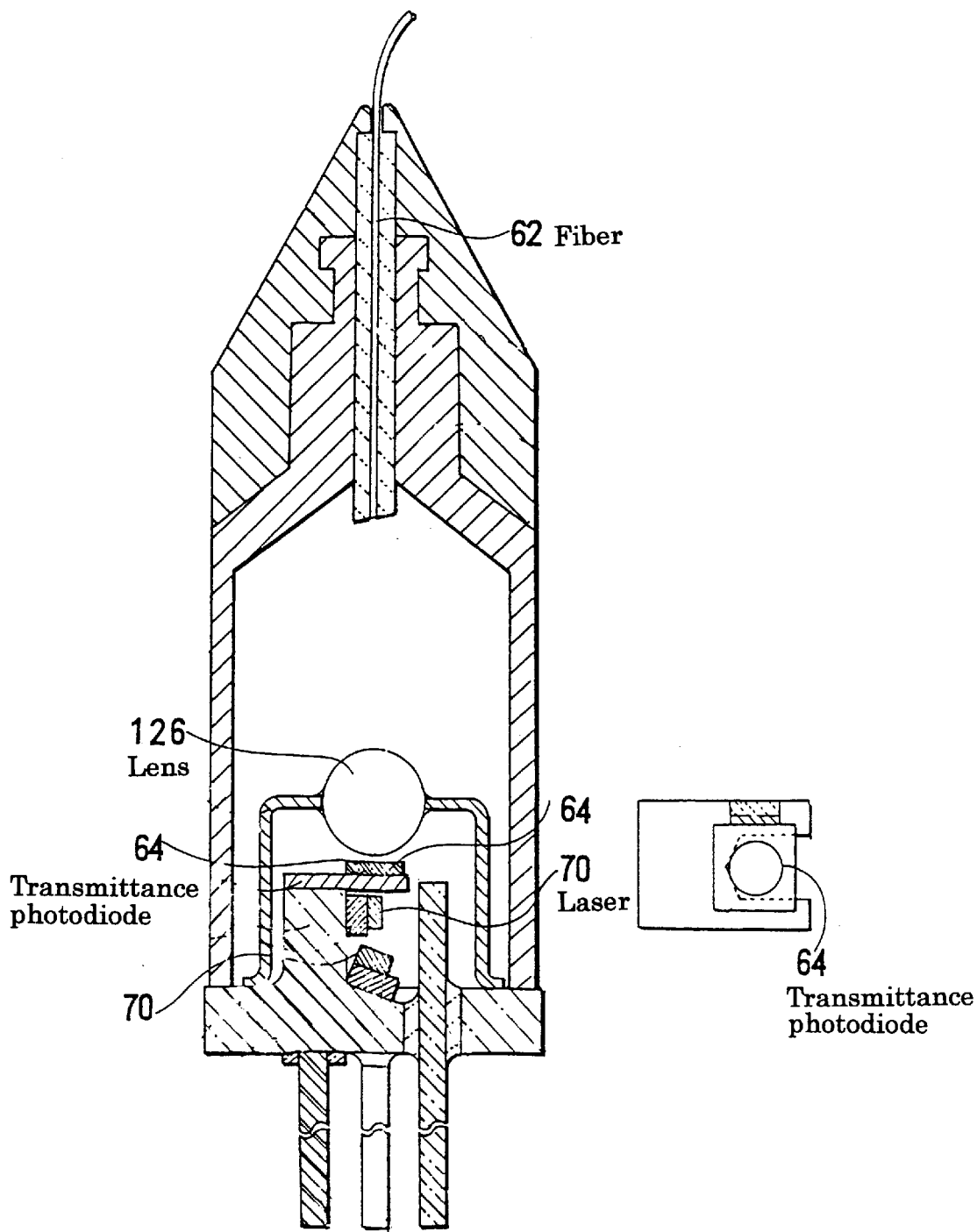
FIG. 2 is a cross-sectional view of the half-transmittance-photodiode module previously fabricated by the present inventors.
Figure 3:
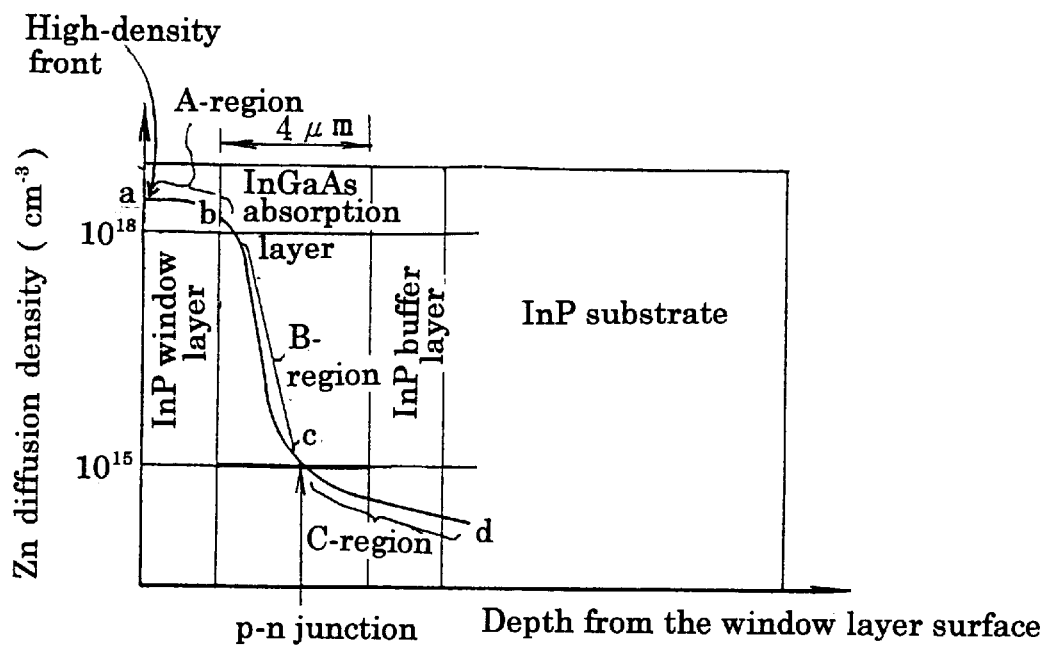
FIG. 3 is a diagram showing the stratified structure and a zinc diffusion-density profile of a conventional photodiode having a thick absorption layer.

On the other hand, (a) poses a problem. If a strong electric field does not exist, free electron-hole pairs generated by light will recombine and disappear. In order to provide a strong electric field, it is necessary to bias the p-n junction reversely. If an alternative step is available to provide an electric field in place of the reverse-bias voltage applied to the p-n junction, the p-n junction is not required to lie in the absorption layer. Then, a steep decline of zinc density in the B-region was noticed, as shown in FIG. 3. The existence of a density gradient of impurities should mean that some amount of electric-potential distribution exists to form an internal electric field. A steep density gradient of p-type impurities such as that seen in the B region may accelerate carriers. Provided that a strong electric field is available, it is not necessary to adhere to the electric field produced by a reverse-bias voltage; an electric field produced by the density gradient of impurities still meets the requirement.

If the density gradient can accelerate the generated carriers, it is possible that the p-n junction may be repelled to the buffer layer below while the B-region is provided in the absorption layer. With a photodiode having a p-n junction and depletion layer in a buffer layer, the following phenomenon is assumed to cause an electric current to flow.

When a photon enters an absorption layer, a free electron-hole pair is generated. The electron proceeds to the buffer layer, and at the depletion layer and p-n junction, is accelerated further by a strong electric field to traverse the buffer layer at high speed and reach a high-density, low-resistance n-type InP substrate.

Figure 5:
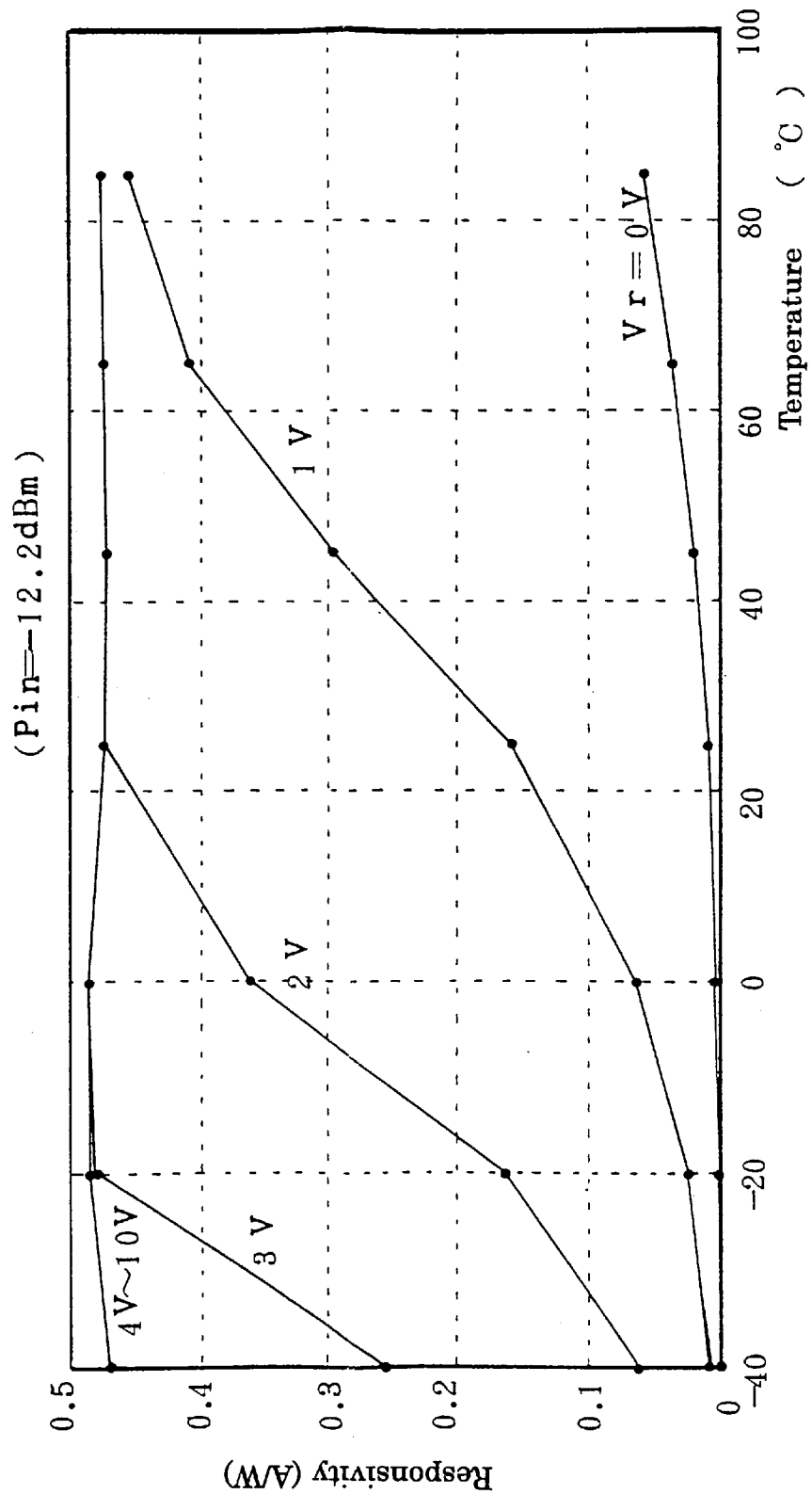
FIG. 5 is a graph showing the temperature dependency of the responsivity, with a source voltage as a parameter, of the half-transmittance photodiode previously fabricated by the present inventors.

In the meantime, the hole proceeds and reaches a $p^+$-region. The hole is not accelerated by the p-n junction. The p-n junction is shifted to the buffer layer in order to increase the zinc density at the hetero-interface between the InP window layer and InGaAs absorption layer. The deeper the p-n junction is brought into the buffer layer, the higher the density of zinc at the hetero-interface may be made, $1 \times 10^{18}$ cm$^{-3}$ or more. When the impurity density is high at the interface, the resistance thereof becomes low and the hole is not trapped by a potential barrier there. If the hole easily surmounts the potential barrier of 0.29 eV there, the problem of a decrease in responsivity at low temperatures as shown in FIG. 5 is considered to be solved.

With the conventional photodiode, carriers readily overcome the potential barrier at the hetero-interface between the window and absorption layers because of high density of p-type impurities there. With the half-transmittance photodiode, however, arranging a p-n junction in a thin absorption layer causes the p-type impurity density at the hetero-interface to decrease, so that it is difficult for carriers to surmount the potential barrier. If the p-n junction is brought deep into the buffer layer, the density of zinc at the hetero-interface may be made sufficiently high to enable the carriers to surmount the potential barrier easily. The present invention is based on such a presumption.

The invention provides a p-n junction in a buffer layer and forms in an absorption layer an internal electric field due to impurity density gradient. By this a half-transmittance photodiode in which responsivity does not drop at low temperatures and low source voltages is offered.

As a measure to directly reduce the potential barrier at the hetero-interface, it is also effective to use quaternary InGaAsP as the absorption layer in place of ternary InGaAs. With InGaAsP, when composition is selected so that a fundamental absorption-edge wavelength $\lambda g$ is 1.42 μm, because the band gap Eg is 0.87 eV, a half of the difference of that of InP (Eg=1.35 eV) is 0.24 eV. The barrier decreases from 0.29 eV to 0.24 eV. This reduction of barrier height will improve the temperature characteristics.

When InGaAsP (Eg=0.87 eV) is used as the absorption layer, responsivity to light of 0.75 to 0.87 eV will disappear in comparison with InGaAs (Eg=0.75 eV). There is no response to light of 1.55 μm. Still, a photodiode only for a 1.3 μm region can operate normally.

The photodiode of the invention functions at low temperatures without a decrease of responsivity. To understand why this was achieved, there are two aspects of the operational principle that need to be explained. One is the origin of the electric field that accelerates free electron-hole pairs in place of a reverse-bias voltage. The other is the reason the temperature characteristics are improved by providing the p-n junction in the buffer layer.

A. Built-in (Self-contained) Electric Field Generated in the Absorption Layer

Figure 12:
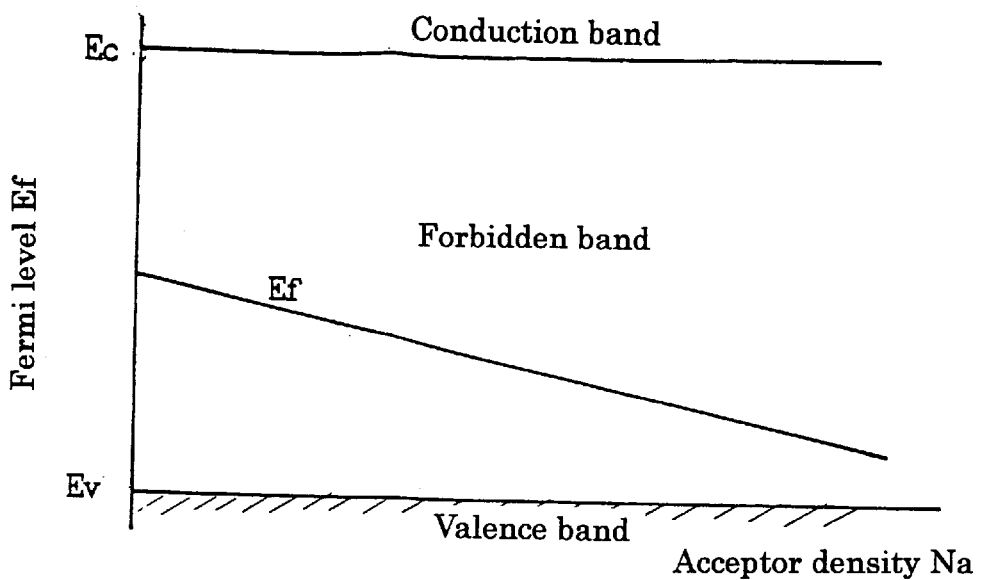
FIG. 12 is a graph showing the variation of the Fermi level in a p-type semiconductor due to acceptor density. The axis of abscissa represents p-type impurity density, and the axis of ordinate of the Fermi level.

With the photodiode of the invention, a reverse-bias voltage is not applied to the absorption layer since the layer has no p-n junction and depletion layer in it. Instead, the layer has a steep gradient of zinc density. A p-type impurity produces an acceptor level. A gradient of acceptor density produces a gradient of the Fermi level, which means a gradient of potential against free electrons and holes. The gradient of the Fermi level provides a built-in electric field. The point is whether or not the Fermi-level gradient provides a sufficient electric field. FIG. 12 is a graph showing the variation of the Fermi level Ef, which is in the forbidden band between the conduction and valence bands, with varying acceptor density Na. With an intrinsic semiconductor, the Fermi level is located at about half the height of the forbidden band. With a p-type semiconductor, the Fermi level lies between the acceptor level and valence band Ev. The Fermi level Ef descends with increasing acceptor (p-type impurity) density. The dependency is $$Ef=Ev-kT\ln\{2(2\pi mkT/h^2)^{3/2}/Na\}, \quad (1)$$

where m is effective mass of the hole, h is the Planck constant, and T is an absolute temperature. Most of the values in the logarithm are constants; only the impurity density Na is a variable. When Na varies from $p_1$ to $P_2$, the Fermi level varies as follows:

$$\Delta Ef=kT\ln\{p_2/p_1\} =0.0257\ln\{p_2/p_1\}. \quad (2)$$

Figure 13:
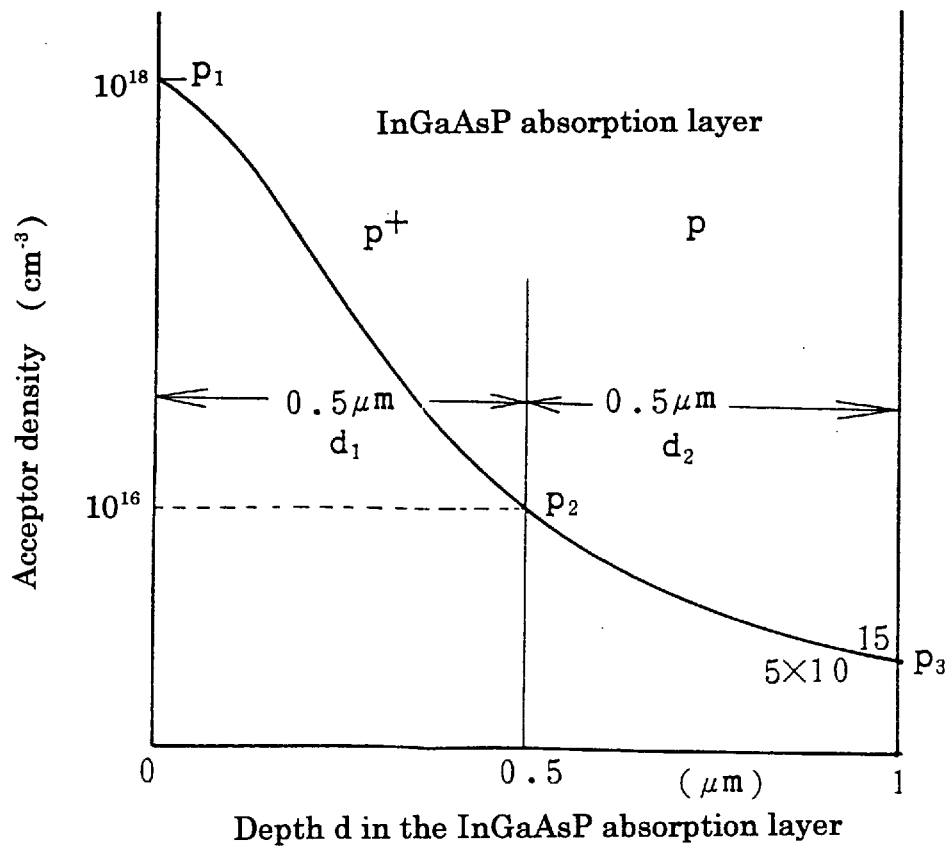
FIG. 13 is a diagram showing an acceptor-density profile in an absorption layer of the photodiode of the present invention. The absorption layer has thickness of 1 $\mu$m. The upper half of the thickness, 0.5 $\mu$m, is a high-density p$^+$-region, and the lower half, 0.5 $\mu$m, is a low-density p region.

With an InGaAsP absorption layer having a thickness as thin as 1 μm, let it be supposed that zinc density decreases from $p_1=1\times10^{18}$ cm$^{-3}$ to $p_2=1\times10^{16}$ cm$^{-3}$ in the upper half of the depth, 0.5 μm, for example as shown in FIG. 13. The decrement in the Fermi level ΔEf in the distance of 0.5 μm at 25° C. (T=298 K) is $$\Delta Ef_{12}=0.118 \text{ eV}. \quad (3)$$

Provided that zinc density decreases from $P_2=1\times10^{16}$ cm$^{-3}$ to $p_3=5\times10^{15}$ cm$^{-3}$ in the lower 0.5 μm, the decrement in the Fermi level is $$\Delta Ef_{23}=0.0178 \text{ eV}. \quad (4)$$

The respective values of field strength are obtained by dividing the foregoing figures by the thickness of 0.5 μm and e.
In the upper half, $$E_1=2360 \text{ V/cm}. \quad (5)$$

In the lower half, $$E_2=356 \text{ V/cm}. \quad (6)$$

In the photodiode of the invention, the absorption layer is in the p-region. When incident light generates free electron-hole pairs, the holes are a majority carrier, which flows into the p-electrode directly. The speed of individual carriers has no relation with the operating speed. The free electrons are a minority carrier. When they flow into the n-side semiconductor, the photocurrent will flow. When the speed of the minority carrier is slow, carriers will disappear by recombination, causing responsivity deterioration. In this case, the absorption layer is thin, and the mobility of the electron is as high as μ=5000 cm²/V sec. The individual times for passing through $d_1$ and $d_2$, $\tau_{d1}$ and $\tau_{d2}$ are; in the upper half, $$\tau_{d1}=4.2 \text{ psec}, \quad (7)$$

in the lower half, $$\tau_{d2}=28 \text{ psec}. \quad (8)$$

The electrons will flow from the absorption layer through the buffer layer to the n-region and become a majority carrier. The electrons generated in the upper half of the absorption layer will enter the buffer layer after the time of $\tau_{d1}+\tau_{d2}$. They will reach the n-region in about 30 psec, which corresponds to a response speed of 10 GHz. The cut-off frequency fc, a frequency at which the responding output decreases by 3 dB, only for the absorption layer is $$fc=2.78/2\pi(\tau_{d1}+\tau_{d2})=13 \text{ GHz}. \quad (9)$$

It was confirmed that the response to 10 GHz is possible since the cut-off frequency of the absorption layer is 13 GHz.

The example above has $d_1=0.5$ μm and $d_2=0.5$ μm. When a sample has a steeper diffusion profile as $d_1=0.2$ μm and $d_2=0.8$ m, the individual transit times are:
in the upper half, $$\tau_{d1}=1.7 \text{ psec}, \quad (10)$$

in the lower half, $$\tau_{d2}=45 \text{ psec}. \quad (11)$$

Since the total transit time is 46.7 psec, the cut-off frequency is 9.1 GHz. This still has a response speed close to 10 GHz.

With conventional photodiodes, carriers are accelerated by the reverse-bias voltage applied to the depletion layer on both sides of the p-n junction. This acceleration is compared with that by the built-in field of the invention. Depending on the reverse-bias voltage (source voltage) and impurity density, the thickness of the depletion layer is about 3 μm when the voltage is 5 V, for example. The field applied to the depletion layer is about $1.6\times10^4$ V/cm. This is greater than the built-in fields shown in (5) and (6). The transit time $\tau_3$ in the depletion layer is $$\tau_3=3\times10^{-4}/[\{5/(3\times10^{-4})\}\times5000]=3.6 \text{ psec}.$$

The cut-off frequency is obtained as fc=120 GHz by the same means as above. The cut-off frequency of the absorption layer of the half-transmittance photodiode of the invention is about 10 GHz, merely about one-tenth the above value. Nonetheless, ordinary digital communication from several 10 Mbps to several Gbps is handled by the photodiode of the invention without difficulty. The above is the explanation of the behavior of the electrons in the absorption layer.

The next is the consideration of the behavior of the electrons in the depletion layer in the InP buffer layer. When a reverse-bias voltage is 2 V, assuming the thickness of the depletion layer is 2 μm, the field strength is 10,000 V/cm. The transit time of the electron $\tau_4=4$ psec. The cut-off frequency fc=110 GHz. Since the electron passes the depletion layer in the buffer layer in 4 psec, and the cut-off frequency is 110 GHz, the foregoing response speed at the absorption layer, 10 GHz, is not disturbed. Furthermore, The outside of the depletion layer in the buffer layer is n-type, and the electrons are a majority carrier there, hence it is not necessary to take the moving speed of the electrons into consideration.

It is the junction capacity that determines the response speed of the buffer layer. The product of the junction capacity and a load resistance, CR, is a time constant, and the reciprocal of 2πCR gives a cut-off frequency. Because the diameter of the photosensitive area of the photodiode in the example below is 140 μm, the capacity of the p-n junction $C_j=2$ pF (Vr=2 V). When an input resistance of 1 kΩ is used for an amplifier, the cut-off frequency is $$fc=1/(2\pi C_j R)=79.6 \text{ MHz}. \quad (12)$$

The response speed represented by this frequency is sufficient for use up to 100 Mbps in digital communication. This frequency is given by a load resistance of 1 kΩ. If the load resistance is 50Ω, the cut-off frequency is 1.6 GHz.

B. Possibility of Diffusion Currents

The aforementioned driving force of the electron movement in the absorption layer is the electric field (self-contained field) generated by the bend of the Fermi level. Next, a possibility of electron movement by diffusion will be described. A great amount of electron-hole pairs are generated in the absorption layer, and light entering the layer from the window layer produces a gradient of electron density, which in turn generates diffusion currents. The diffusion coefficient of electrons in InGaAs is $D_n$=259 cm$^2$/sec. The cut-off frequency of the diffusion current is $$f_{diff} = 2.4 D n / 2\pi d^2 \tag{13}$$

Because d=1 μm, $f_{diff}$=9.9 GHz. This is slower than that of an electric field generated by the bend of the Fermi level but still sufficiently fast for the use in digital communications at a signal speed of 100 Mbps.

InGaAsP has a smaller Dn than InGaAs, hence a lower cut-off frequency than 9 GHz. Yet, the same is sufficiently usable as a photodiode in receivers at a signal speed of 100 MHz.

Next is an exemplification of why electrons do not recombine with holes in the absorption layer. The point is why the free electrons in free electron-hole pairs generated by incident light are not absorbed in the absorption layer when the existing field is weaker than the reverse-bias voltage. The transit time in the p$^+$-region is 4.2 psec. The lifetime of the electrons in the p-layer is 200 psec in the case of InGaAs. The electrons generated in the p$^+$-layer pass the p-layer in 29 psec. Since this is about one-tenth the lifetime, they do not recombine. Even an electric field generated by the gradient of the Fermi level can accelerate electrons sufficiently so that the recombination loss is negligible.

The following conclusions are obtained with the half-transmittance photodiode, having a p-n junction in a buffer layer and having a p-type absorption layer:

(a) It is elucidated that a self-contained electric field generated by a density profile of zinc produces a drift of photocarriers, which gives a cut-off frequency of about 10 GHz.

(b) It is exemplified that an absorption layer as thin as about 1 μm can also generate a diffusion current with a response speed of about 10 GHz.

(c) An actual response speed in practical use is determined by the cut-off frequency of 80 MHz governed by the product of a preamplifier's effective input resistance, 1 kΩ, and a capacitance $C_j$=2 pF. The cut-off frequency increases with the decrease in input resistance.

(d) The photocarriers generated in a p-layer are accelerated by the self-contained electric field to pass through the p-layer in a time one-order shorter than the lifetime of the minority carrier, producing a photocurrent.

(e) In conclusion, the half-transmittance photodiode of the invention operates at high speed because the same has a device structure in which the absorption layer is converted into p-type, so that only high-speed electrons take part in the operation thereof.

C. Mechanism of Improving the Temperature Characteristics at Low Temperatures

Figure 6:
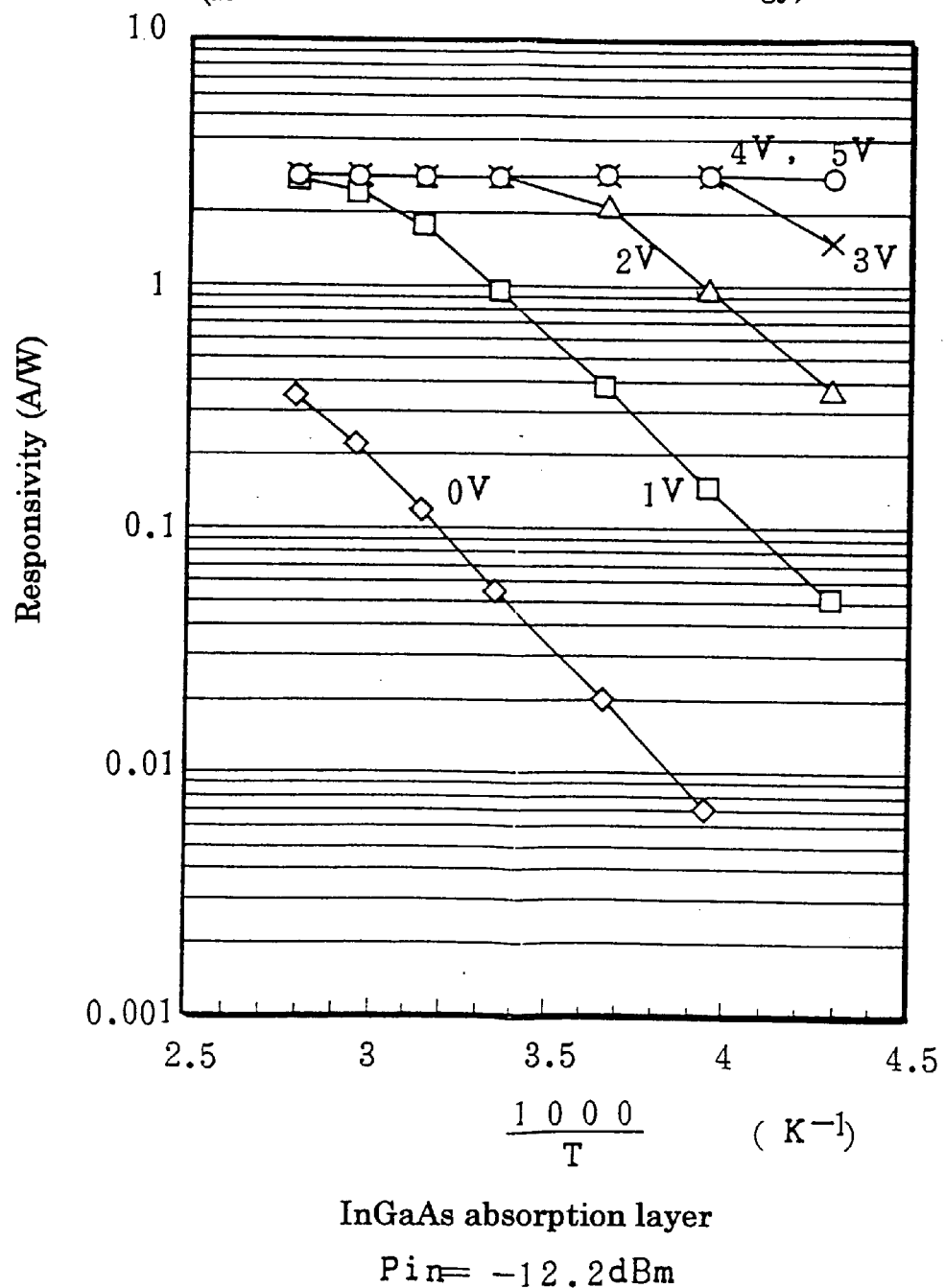
FIG. 6 is a graph showing the temperature dependency of the responsivity, with a source voltage as a parameter, of the half-transmittance photodiode previously fabricated by the present inventors. This graph is a conversion of the graph in FIG. 5 to calculate activation energy.

The photodiode of the invention converts an absorption layer into p-type. It was made possible to convert the thin absorption layer as a whole into p-type by forcing a p-n junction into a buffer layer. The photodiode of the invention has a temperature characteristic in which responsivity shows little decrease even at −20° C. The characteristic improvement is quite clear in comparison with the data shown in FIGS. 5 and 6. The remaining point is why the photodiode of the invention does not deteriorate at low temperatures. In order to clarify the reason, it is necessary to consider the change in the band structure of the semiconductor.

FIG. 14 shows the band structure of a conventional standard photodiode having a thick absorption layer as shown in FIG. 3. The absorption layer (4 μm) is thicker than a depletion layer (2 to 3 μm). The depletion layer is included in the absorption layer with conventional photodiodes. A p-layer is placed on the left, and an n-layer on the right. The depletion layer has a thickness of s-t, and the absorption layer e-f. The absorption layer is of InGaAs or InGaAsP and has a narrower band gap than a window layer or a buffer layer on both sides thereof, so that the band has a discontinuity at the boundary.

The boundary-e between the window and absorption layers belongs to the p-region, so that the valence band has no discontinuity here. The valence band connects the window and absorption layers smoothly. On the other hand, the conduction band has a gap at a point-u. The magnitude of the gap is equal to the difference in band gap between the InP window layer (1.35 eV) and the absorption layer. With the InGaAs absorption layer (0.75 eV), the gap is 0.6 eV; with the InGaAsP absorption layer (0.87 eV), the gap is 0.48 eV.

In the depletion layer s-t, the p-type and n-type impurities that have lost the charges thereof cause the bands to decline. The conduction band declines between v and w; the valence band between x and y.

The other boundary-f between the absorption and buffer layers belongs to the n-region, so that the conduction band maintains continuity whereas the valence band does not. The valence band has a gap at a point-z. The magnitude of the gap is 0.6 eV with the InGaAs absorption layer. This condition is equivalent to a condition where a reverse-bias voltage is slightly applied; i.e., the p-region has holes, and the n-region electrons. When incident light generates electron-hole pairs in the absorption layer, the electrons slide down the gradient v-w produced by the reverse-bias voltage and enter the sea of electrons in the n-region. The holes enter the sea of holes via y-x. Gaps-u and -z are no hindrance since they are out of the way.

Figure 4:
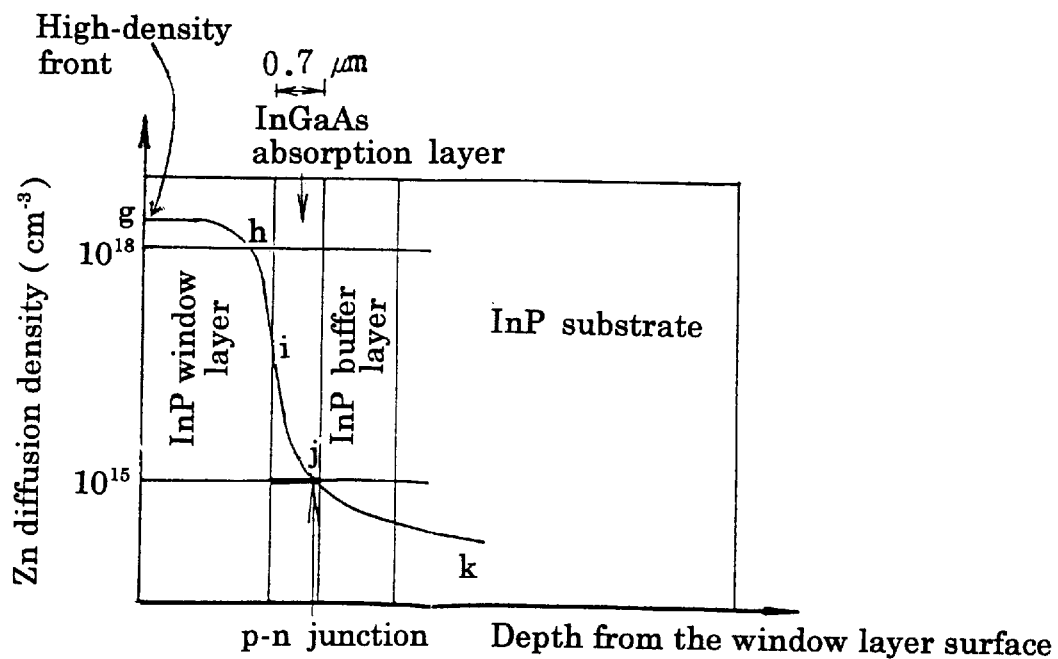
FIG. 4 is a diagram showing the stratified structure and a zinc diffusion-density profile of the half-transmittance photodiode previously fabricated by the present inventors.

FIG. 15 is the band diagram of the half-transmittance photodiode previously offered by the present inventors, which corresponds to FIG. 4. The absorption layer is as thin as about 0.7 or 1 μm, which is thinner than the depletion layer s-t. The depletion layer has a gradient of the valence band i1-j1-w1-o1 and a gradient of the conduction band a1-b1-g1-h1. Due to a reverse-bias voltage, the p-region has holes and the n-region electrons. Since the absorption layer has a narrow band gap and the neighboring window and buffer layers have a wide band gap, gaps will be produced in the bands at the boundaries-e and -f. Since the absorption layer is inside the depletion layer, the Fermi level lies at about the middle of the forbidden band. The depletion layer on both sides of the absorption layer also has the Fermi level at around the middle of the forbidden band. Therefore, the gap is divided, and half goes to the conduction band and the other half to the valence band. The conduction band has gaps b1-c1 and d1-g1, each being about 0.3 eV. The valence band has gaps j1-k1 and l1-m1, each also being 0.3 eV.

When light is incident, electrons are excited from the valence band to the conduction band in the absorption layer. The electrons collect at the well-type potential b1-c1-d1-g1. The holes also collect at the well-type potential m1-l1-k1-j1.

The resemblance in behavior between the electrons and holes ends there, and asymmetry begins. An electron has small effective mass, a long mean free path, a long relaxation time, and high mobility. Accordingly, it easily obtains kinetic energy and readily surmounts the barrier of 0.3 eV to flow. A hole has large effective mass, a short mean free path, a short relaxation time, and low mobility. Consequently, it easily loses energy by collision even when it flows along the slope of the potential Hence, it has difficulty surmounting the barrier k1-j1 of 0.3 eV. At high temperatures, it can surmount the barrier, but at low temperatures, it cannot. A notion that even if the hole does not flow into the p-region, the electron flow will compensate for it is misleading. When the holes do not flow due to the barrier k1-j1, even if electron-hole pairs are generated steadily, electrons will recombine with densely populated holes and decrease the flow thereof. This is the cause of the responsivity drop at low temperatures appearing in FIGS. 5 and 6. The temperature dependency of the activation energy of 0.29 eV is attributable to the phenomenon that the holes are blocked by the barrier of 0.3 eV.

Figure 7:
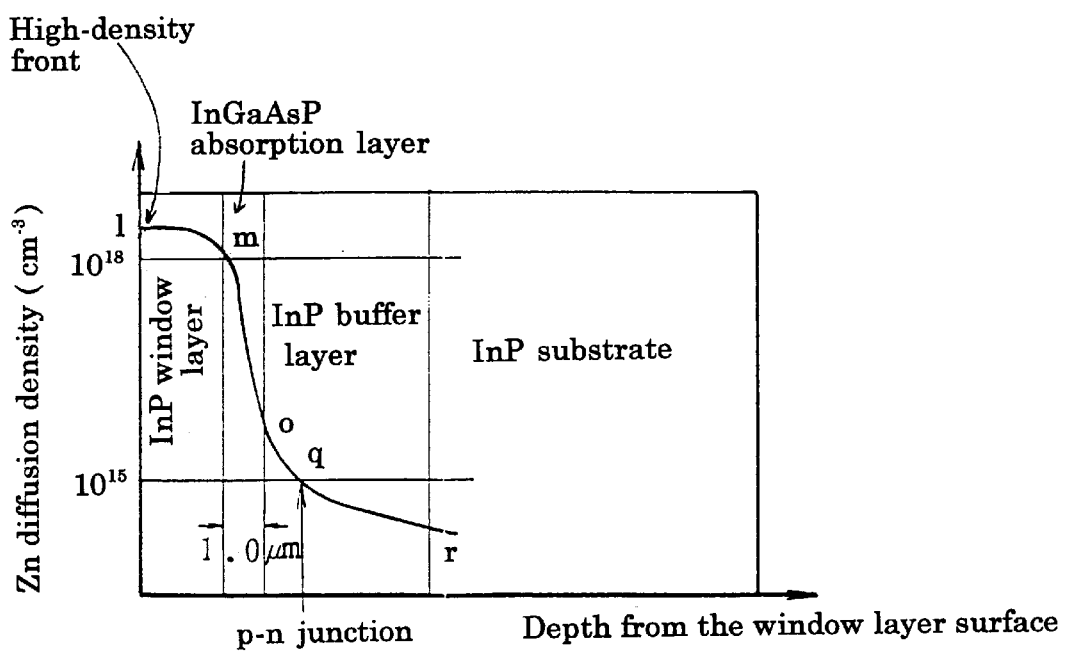
FIG. 7 is a diagram showing the stratified structure and a zinc diffusion-density profile of the half-transmittance photodiode of the present invention.
Figure 16:
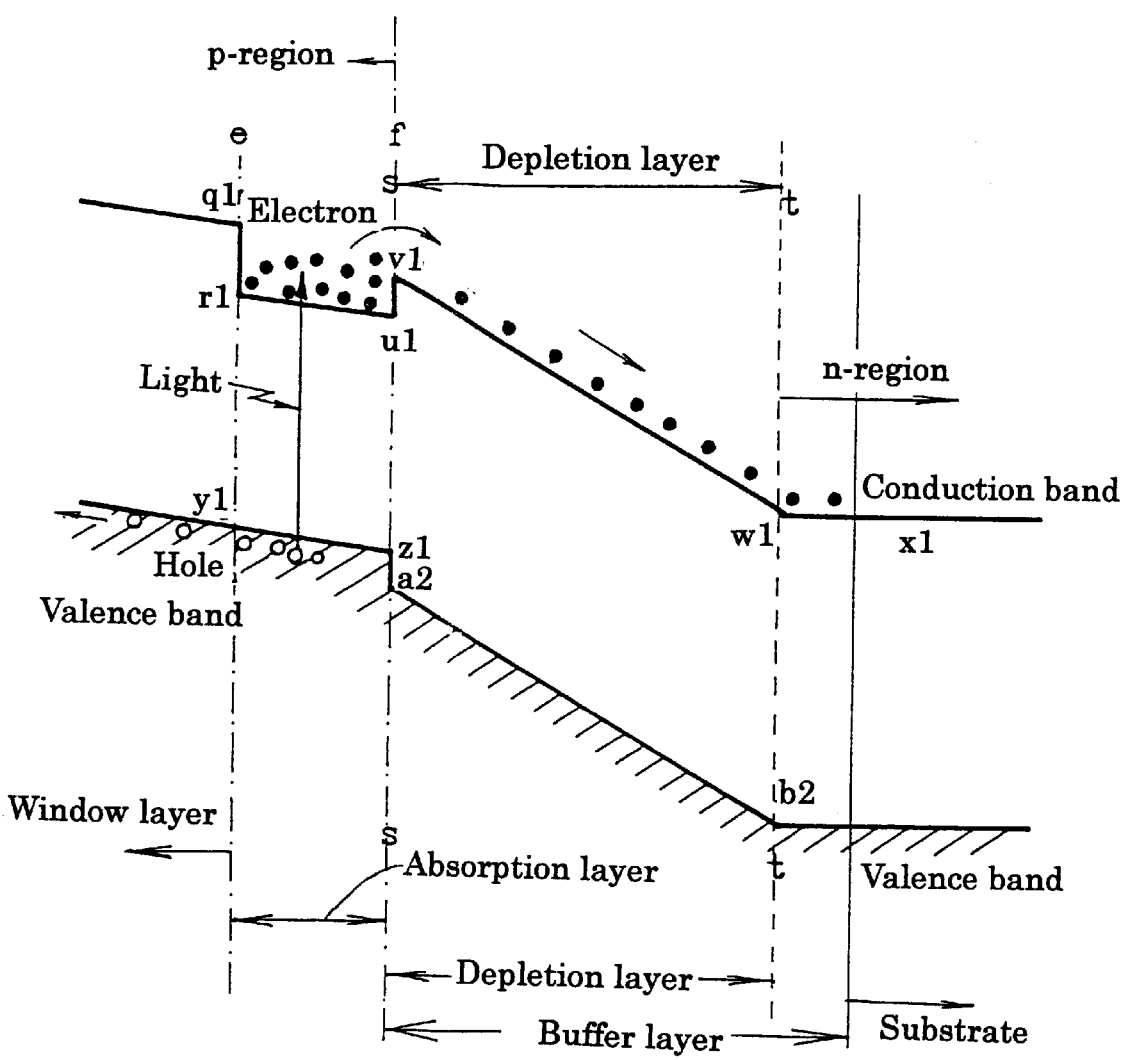
FIG. 16 is a band diagram of the photodiode of the present invention having a thin absorption layer that lies in a p-region, with a depletion layer lying in a buffer layer.

FIG. 16 is the band diagram of the photodiode of the invention, which corresponds to FIG. 7. The depletion layer s-t is shifted to the right of the absorption layer e-f. The hetero-interface on the left of the absorption layer is in the p-region, and the valence band y1-z1 is continuous at the boundary-e. Conversely, the conduction band has discontinuity of q1-r1 and u1-v1. The level difference in the band is correspondent to the band-gap difference with the InP on both sides thereof. With InGaAs, the level difference q1-r1 is about 0.6 eV. Since the left edge of the depletion layer is coincident with the hetero-interface between the absorption and buffer layers, the level difference in the conduction band v1-u1 is 0.3 eV and that in the valence band z1-a2 is also 0.3 eV. The lines r1-u1 and y1-z1 incline with the Fermi-level gradient produced by the zinc-density gradient. The depletion layers v1-w1 and b2-a2 decline due to unneutralized p-type and n-type impurities. The reverse-bias voltage generates holes in the p-region and electrons in the n-region. At the absorption layer incident light excites electrons from the valence band to the conduction band. The holes generated at the same time innately belong to the majority carrier and create an electric current flowing toward the p-electrode. The potential gradient causes the current to flow smoothly. There exists no such a barrier as k1-j1 shown in FIG. 15, which traps holes to limit the electric current. Contrary to this, the electrons are trapped by the well-type potential q1-r1-u1-v1. However, having small effective mass (about 0.08 times the mass of a free electron), large mobility (5000 cm$^2$/Vsec), and a long mean free path, the electron is readily accelerated. Accordingly, the electrons can exploit the energy given by the electric field and clear the gap v1-u1. The electrons are accelerated in the course from v1 to w1 in the depletion layer and enter the n-region.

As mentioned above, the temperature characteristic is improved since the provision of the absorption layer within the p-region results in the disappearance of the potential gap between the absorption and window layers, offering a smooth pass for the holes.

To summarize the above, the half-transmittance photodiode of the invention enables the construction of "ping-pong transmission"-type optical communication systems without optical couplers. The half-transmittance photodiode itself is a novel invention by the present inventors. Whereas a half-transmittance photodiode having a p-n junction in an absorption layer has an inferior temperature characteristic as shown in FIG. 5, the half-transmittance photodiode of the invention has an excellent temperature characteristic, i.e., the responsivity shows no deterioration at low temperature. This is realized by placing the p-n junction in a buffer layer. The photodiode of the present invention is applicable to receivers in optical subscriber systems installed outdoors as well as indoors. The invention paves the way to fulfill low-cost optical communications.

EXAMPLE

The following example has a quaternary-InGaAsP absorption layer with a fundamental absorption-edge wavelength of $\lambda$g=1.42 μm. As shown in FIG. 7, the absorption layer has thickness of 1 μm to achieve 50-percent transmittance for a 1.31 μm wave. When InGaAs is used as the absorption layer, the thickness should be 0.5 to 0.9 μm to fulfill transmittance of 30 to 50%. Other aspects of the two materials are the same, and the following description is given on InGaAsP.

The concept of the present invention is well explained by comparing the layer thickness and impurity distribution shown in FIG. 7 with those in FIG. 3 for a conventional photodiode. A thinner absorption layer is one of the features of the invention. A thicker buffer layer, obtaining extra thickness from the decrement of the absorption-layer thickness, secures the formation of a p-n junction within the buffer layer.

Figure 8:
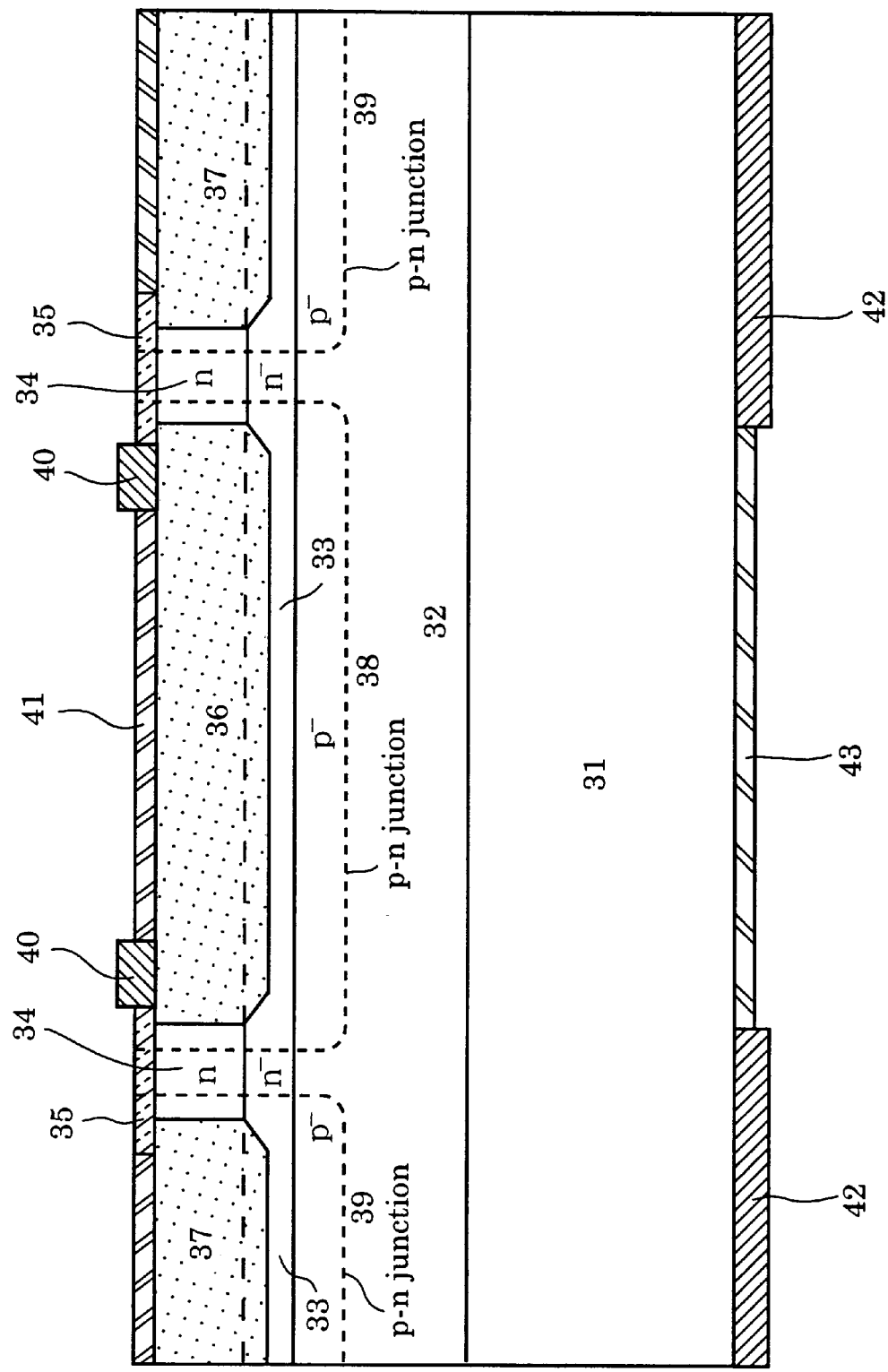
FIG. 8 is a cross-sectional view of the half-transmittance photodiode of the present invention.
Figure 9:
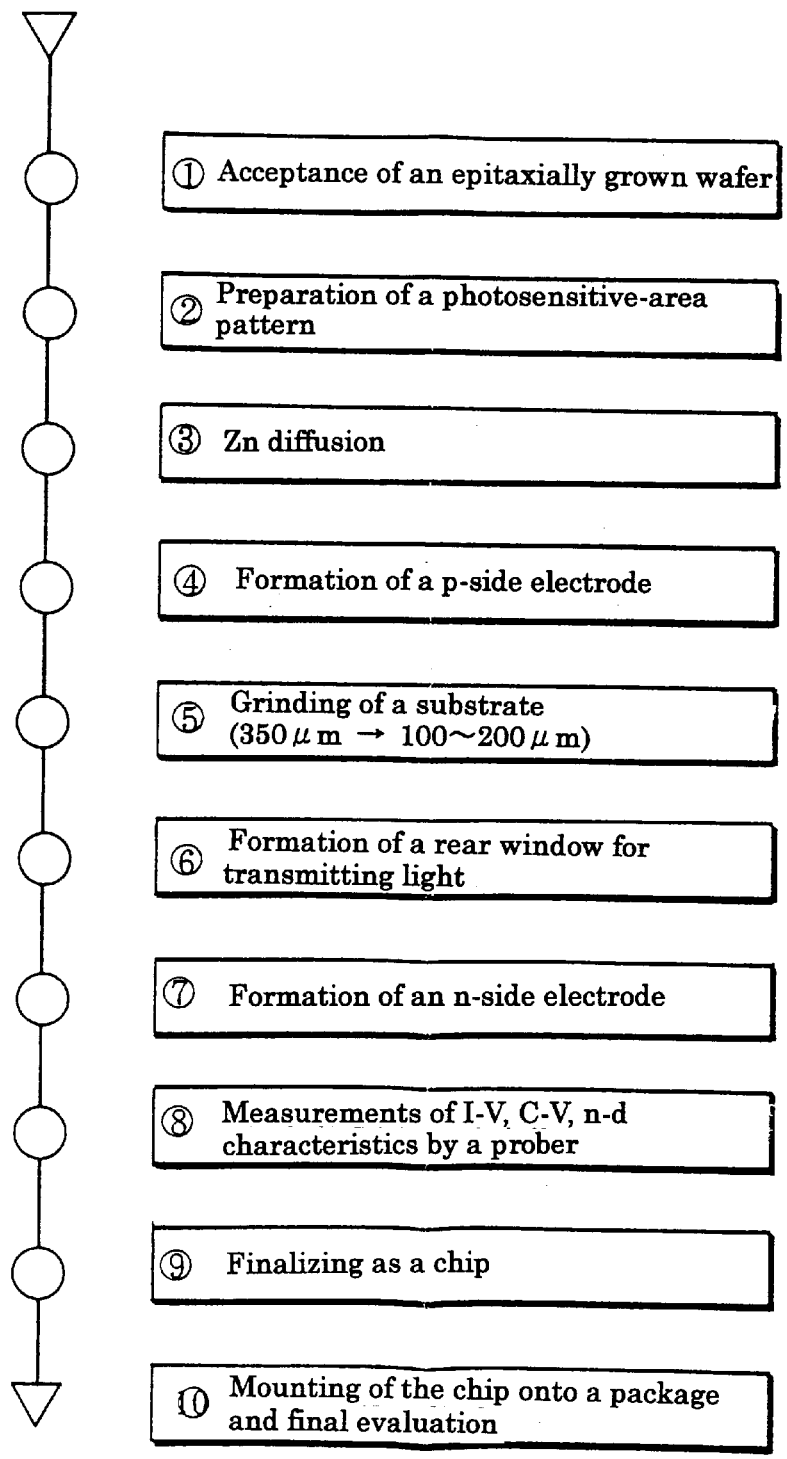
FIG. 9 is a chart showing the fabricating process of the half-transmittance photodiode of the present invention.

The structure shown in FIG. 7 is embodied in FIG. 8, which shows an actual structure of the half-transmittance photodiode of the invention. The fabricating process thereof is shown in FIG. 9.

(1) On a sulfur-doped n-type InP substrate 31 (thickness: 350 μm, carrier density: n=5×10$^{18}$ cm$^{-3}$), epitaxially grown by the chloride vapor-phase epitaxy method were an InP buffer layer 32 (thickness: 4 μm, n=1×10$^{15}$ cm$^{-3}$), an InGaAsP absorption layer 33 (thickness: 1 μm, n=1×10$^{15}$ cm$^{-3}$), and an InP window layer 34 (thickness: 2 μm, n=2×10$^{15}$ cm$^{-3}$).

(2) The epitaxial wafer was covered with an SiN layer 35. The SiN layer as then partly removed at the diode center and periphery by photolithography. The remaining SiN film is a passivation layer. Zinc diffusion with a mask of the SiN layer produced a p$^+$-region 36 at the diode center and a p$^+$-region 37 at the diode periphery. A boundary where the n-type impurity density matches with the p-type impurity density is a p-n junction. A p-n junction 38 at the central part and a p-n junction 39 at the periphery were produced.

(3) The zinc diffusion was carried out for 14 minutes at 600° C. by the closed-tube method using Zn, As, and P as the material. The central p-region is a photosensitive region. The peripheral p-region, called a diffused-shield region, prevents the photocarriers generated by incident light to the peripheral part from intruding into the photosensitive region. Thus, a time lag due to the light that is incident to the periphery is prevented.

Figure 10:
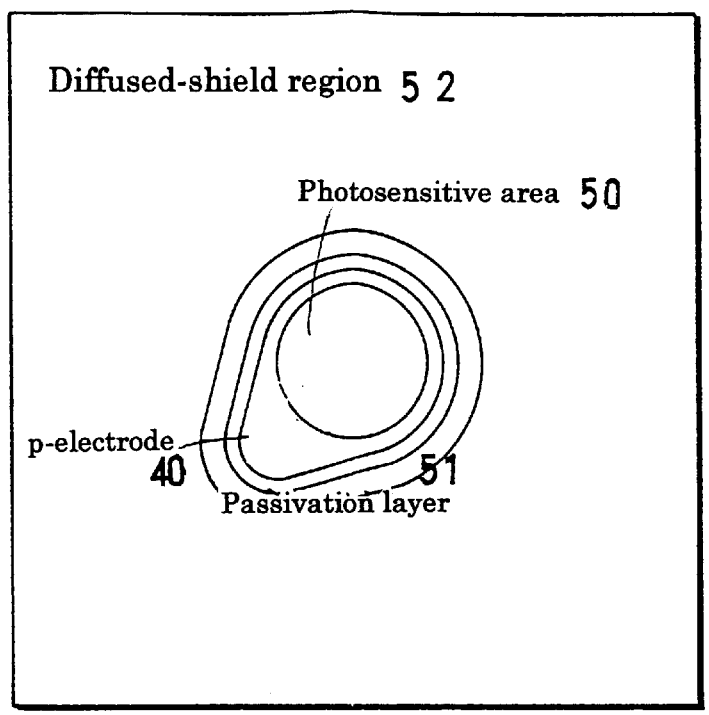
FIG. 10 is a plan view of the photodiode chip of the present invention.

A plan view for a diode is shown in FIG. 10. A photosensitive surface 50 is located at the center, which is surrounded by a p electrode 40. The p-electrode is not a simple circle, because the electrode includes a pad for bonding an electric wire. The p-electrode is surrounded by a passivation-layer pattern 51, of which the outside is the diffused-shield region 52.

(4) Zinc diffusion depth was measured placing an InP monitoring substrate beside the sample when diffusion was conducted. It was confirmed that the crooked point (p=1×10$^{18}$ cm$^{-3}$) between an A-region (p>1×10$^{18}$ cm$^{-3}$) and a B-region (p<1×10$^{18}$ cm$^{-3}$) is coincident with the hetero-interface (depth: 2 μm) between the InP window layer and the InGaAsP absorption layer. A zinc-density profile of the epitaxial wafer is shown in FIG. 7, which was obtained by SIMS measurement on a completed photodiode chip. It was also confirmed by the relation between the carrier density and depth (an n-d profile) that the p-n junction is formed within the buffer layer.

(5) A ring-shaped p-side electrode (AuZn-based) 40 was formed on the p-region 36. The InP substrate 31 was ground from the rear to reduce the thickness to 100 μm, because reduction of the optical length facilitates easy coupling of the light from a rear semiconductor laser with an optical fiber. A ring-shaped n-side electrode (AuGeNi-based) 42 was formed on the rear of the InP substrate 31. An anti-reflection layer 41 was applied to the surface of the photosensitive region surrounded by the ring-shaped p-side electrode 40. The anti-reflection layer is SiON having thickness of λ/4n, where λ is a wavelength and n is a refractive index. An anti-reflection layer 43 was similarly applied to the surface of the substrate 31 surrounded by the ring-shaped n-side electrode 42.

(6) A completed photodiode chip was die-bonded to a package with AuSn solder. The electrodes were bonded to pins with Au wires 20 μm in diameter. The photodiode was coupled with a single-mode fiber optically by a lens to complete a pigtail-type photodiode module.

Figure 11:
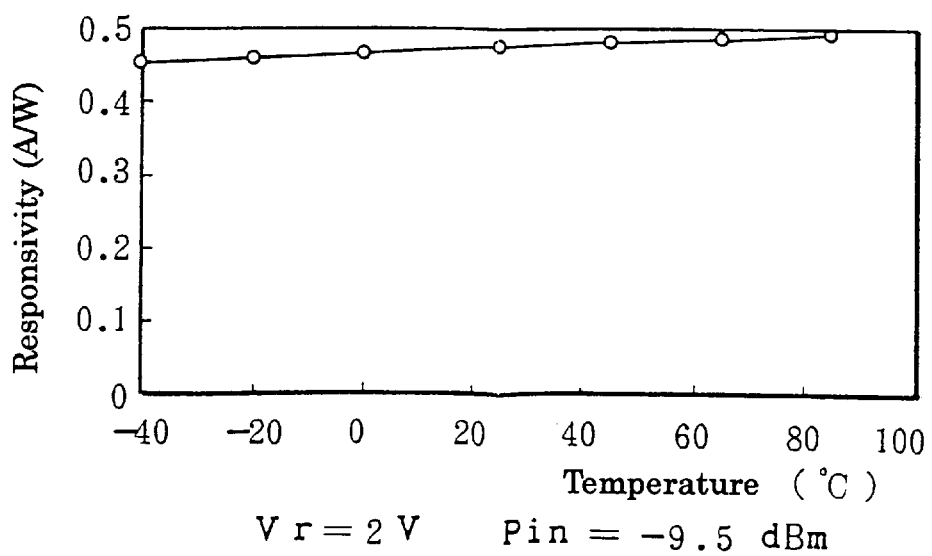
FIG. 11 is a graph showing the temperature dependency of the responsivity of the photodiode of the present invention.

(7) A temperature characteristic was measured on this module. The results are shown in FIG. 11 when a source voltage is 2 V. Whereas the result shown in FIG. 5 exhibits a notable decrease tendency in responsivity at 25° C., with 2 V the result obtained on the sample of the present invention has no decrease tendency at 25° C. The module has sufficient responsivity even at as low as −40° C. The responsivity is 0.47 A/W at 25° C. and no less than 0.46 A/W at −40° C. Even in a wide range of −40 to +80° C., the responsivity is as stable as 0.46 to 0.49 A/W. The electrostatic capacity of the sample was no more than 2.0 pF at 2 V. In conclusion, the module has sufficient characteristics for 50-Mbps communications.

What is claimed is:

1. A photodiode comprising:

an n-type semiconductor substrate;

an n-type buffer layer, an n-type absorption layer, and an n-type window layer, which are grown epitaxially in succession in this order on the n-type semiconductor substrate;

a p-region formed by the diffusion of p-type impurities from the window layer side so that the region covers the window layer, the absorption layer and, part of the buffer layer;

a p-n junction formed inside the buffer layer;

a p-electrode formed on the p-region of the window layer; and an n-electrode formed on the n-type substrate.

2. A photodiode comprising:

a p-type semiconductor substrate;

a p-type buffer layer, a p-type absorption layer, and a p-type window layer, which are grown epitaxially in succession in this order on the p-type semiconductor substrate;

an n-region formed by the diffusion of n-type impurities from the window layer side so that the region covers the window layer, the absorption layer, and part of the buffer layer;

a p-n junction formed inside the buffer layer;

an n-electrode formed on the n-region of the window layer; and a p-electrode formed on the p-type substrate.

3. The photodiode as defined in claim 1, wherein:

the n-type semiconductor substrate is an n-InP substrate;

the n-type buffer layer is an n-InP buffer layer;

the n-type absorption layer is an n-InGaAs or n-InGaAsP absorption layer; and the n-type window layer is an n-InP window layer.

4. The photodiode as defined in claim 3, wherein the p-type impurities are zinc.

5. The photodiode as defined in claim 4, wherein:

the n-type semiconductor substrate has a carrier density of $(1 \text{ to } 10) \times 10^{18}$ cm$^{-3}$;

the n-type buffer layer has a carrier density of $(0.5 \text{ to } 3) \times 10^{15}$ cm$^{-3}$;

the n-type absorption layer has a carrier density of $(0.5 \text{ to } 3) \times 10^{15}$ cm$^{-3}$;

the n-type window layer has a carrier density of $(1 \text{ to } 4) \times 10^{15}$ cm$^{-3}$.

6. The photodiode as defined in claim 5, wherein at least one other p-n junction is formed by zinc diffusion outside the p-n junction.

7. The photodiode as defined in claim 6, wherein an interface between the n-type window layer and the n-type absorption layer has a carrier density, produced by zinc diffusion, of $(1 \text{ to } 5) \times 10^{18}$ cm$^{-3}$.

8. The photodiode as defined in claim 7, wherein the interface between the n-type absorption layer and the n-type buffer layer has a carrier density, produced by zinc diffusion, of $3 \times 10^{15}$ cm$^{-3}$ or more.

9. A photodiode as defined in claim 3, wherein the InGaAs layer has a thickness of 0.5 to 0.9 μm.

10. A photodiode as defined in claim 3, wherein the InGaAsP layer has a composition that corresponds to a fundamental absorption-edge wavelength of λg of 1.40 to 1.44 μm.

11. A photodiode as defined in claim 3, wherein the InGaAsP layer has a thickness of 0.8 to 1.2 μm.

12. A transceiver module comprising the photodiode as defined in claim 1, a laser diode, a monitoring photodiode, and a lens optically combined with an optical fiber.

13. A system comprising the transceiver module as defined in claim 12 characterized with one wavelength through one optical fiber.

14. The photodiode according to claim 1 wherein said p-n junction is formed only inside said buffer layer.

15. The photodiode according to claim 2 wherein said p-n junction is formed only inside said buffer layer.

* * * * *